(12) United States Patent
Shimizu et al.

(10) Patent No.: US 7,256,500 B2
(45) Date of Patent: Aug. 14, 2007

(54) SEMICONDUCTOR DEVICE USING METAL NITRIDE AS INSULATING FILM

(75) Inventors: Noriyuki Shimizu, Kawasaki (JP); Yoshiyuki Nakao, Kawasaki (JP); Hiroki Kondo, Nagoya (JP); Takashi Suzuki, Kawasaki (JP); Nobuyuki Nishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/362,872

(22) Filed: Feb. 28, 2006

(65) Prior Publication Data

US 2006/0145348 A1 Jul. 6, 2006

Related U.S. Application Data

(62) Division of application No. 10/352,149, filed on Jan. 28, 2003, now Pat. No. 7,042,093.

(30) Foreign Application Priority Data

May 8, 2002 (JP) ............................. 2002-133055

(51) Int. Cl.
*H01L 23/48* (2006.01)
*H01L 23/52* (2006.01)
*H01L 29/40* (2006.01)

(52) U.S. Cl. ................ 257/758; 257/761; 257/E23.145

(58) Field of Classification Search ................ 257/758, 257/759, 761, 762, 774, E23.145
See application file for complete search history.

(56) References Cited

U.S. PATENT DOCUMENTS

| 6,180,514 B1 | 1/2001 | Yeh et al. |
| 6,291,891 B1 | 9/2001 | Higashi et al. |
| 6,605,874 B2 | 8/2003 | Leu et al. |
| 6,750,541 B2 | 6/2004 | Ohtsuka et al. |
| 2004/0026364 A1 | 2/2004 | Kihara et al. |

FOREIGN PATENT DOCUMENTS

| JP | 09-246375 | 9/1997 |
| JP | 2001-230219 A | 8/2001 |
| JP | 2002-124568 | 4/2002 |
| JP | 2003-17496 A | 1/2003 |

OTHER PUBLICATIONS

Japanese Office Action dated Oct. 31, 2006 (mailing date), issued in corresponding Japanese Patent Application No. 2002-133055.

*Primary Examiner*—Hoai Pham
(74) *Attorney, Agent, or Firm*—Westerman, Hattori, Daniels & Adrian, LLP.

(57) ABSTRACT

A first insulating film is formed on a semiconductor substrate. A second insulating film made of insulating metal nitride is formed on the first insulating film. A recess is formed through the second insulating film and reaches a position deeper than an upper surface of the first insulating film. A conductive member is buried in the recess. A semiconductor device is provided whose interlayer insulating film can be worked easily even if it is made to have a low dielectric constant.

2 Claims, 12 Drawing Sheets

SEMICONDUCTOR DEVICE USING METAL NITRIDE AS INSULATING FILM

This application is a division of application Ser. No. 10/352,149, filed on Jan. 28, 2003, now U.S.Pat. No. 7,042,093.

CROSS REFERENCE TO RELATED APPLICATION

This application is based on Japanese Patent Application No. 2002-133055, filed on May 8, 2002, the entire contents of which are incorporated herein by reference.

BACKGROUND OF THE INVENTION

1) Field of the Invention

The present invention relates to a semiconductor device and its manufacture method, and more particularly to a semiconductor device having the wiring structure formed by burying conductive material in a trench formed through an insulating film above a semiconductor substrate.

2) Description of the Related Art

Development of processing techniques of large scale integrated circuit devices (LSI) makes each semiconductor element increasingly smaller. High density, multi-layers and thinning of wiring lines in LSI are advancing so that stress applied to the wiring lines and the density of current flowing in the wiring lines are increasing more and more. As the density of current flowing in a wiring line increases, electromigration (EM) is likely to occur so that a wiring line may be broken. It is considered that electromigration occurs because electrons transported in a wiring line collide with metal atoms constituting the wiring line and the metal atoms move or diffuse. As semiconductor elements are made finer, the deterioration of elements by electromigration becomes serious. It is necessary to develop the wiring material and wiring structure which have a high reliability and can suppress electromigration even if current of a high density is flowed.

Copper is wiring material which is more resistant against electromigration than aluminum. However, a copper layer is difficult to be finely worked more than an aluminum layer. A damascene method is practically used as an effective method of forming a wiring line. According to the damascene method, a wiring trench is formed beforehand through an insulating film, copper is buried in this trench, and unnecessary copper is removed to form a wiring line. A dual damascene method is also known by which upper and lower wiring trenches and a via hole connecting the trenches are formed and wiring material is buried in the wiring trenches and via hole at the same time.

High integration and miniaturization of LSI actualize a delay of an electric signal conveyed in a wiring line. In order to reduce a transmission delay of an electric signal, it is important to lower the resistance of wiring material and the dielectric constant of an interlayer insulating film. If low dielectric constant material is used for an interlayer insulating film, it becomes more difficult to form wiring trenches and via holes than using conventional materials of an interlayer insulating film such as undoped silicate glass (silicon oxide, hereinafter abbreviated to USG) and fluorine-doped silicate glass (SiOF, hereinafter abbreviated to FSG).

Known insulating film materials having a low dielectric constant include organic polymer having carbon as its main composition, carbon-containing silicon oxide, and porous materials of these materials. If such low dielectric constant insulating materials are used for an interlayer insulating film, the following problems occur.

First, tight adhesion of an interlayer insulating film to an etching stopper layer, a cap layer, a sacrificial film under chemical mechanical polishing, and a hard mask such as an insulating film and a barrier metal layer is degraded. If stress in terms of thermodynamics is generated during processes such as CMP, heat treatment and bonding, films are likely to be scaled off.

Second, an etching selectivity is lower between an interlayer insulating film and an etching stopper layer of silicon nitride, silicon oxide, silicon carbide or the like and a hard mask. It is therefore difficult to pattern an interlayer insulating film made of low dielectric constant insulating material.

Third, if an interlayer insulating film is made to have a low dielectric constant, a mechanical strength and a thermal stability of the insulating film are degraded. The insulating film may be broken during manufacture processes.

Fourth, if an insulating film is made of porous material, the insulating film is likely to be subjected to secular change and deterioration because of the absorption of moisture in the air, oxidation via fine voids and the like.

SUMMARY OF THE INVENTION

It is an object of the invention to provide a semiconductor device and its manufacture method capable of easily working an interlayer insulating film even if the film is made to have a low dielectric constant.

According to one aspect of the present invention, there is provided a semiconductor device comprising: a first insulating film formed on a semiconductor substrate; a second insulating film consisting of insulating metal nitride and formed on said first insulating film; a recess formed through said second insulating film and reaching a position deeper than an upper surface of said first insulating film; and a conductive member filled in said recess.

The semiconductor device constructed as above can be manufactured by forming the recess in the first insulating film by using the second insulating film of metal nitride as a mask.

According to another aspect of the present invention, there is provided a semiconductor device comprising: a lower wiring layer containing a plurality of wiring lines and formed on a semiconductor substrate; an upper wiring layer containing a plurality of wiring lines and formed on said lower wiring layer; and an interlayer insulating film disposed between said lower and upper wiring layers and consisting of insulating metal nitride.

A dielectric constant of the interlayer insulating film can be lowered by using metal nitride as the material of the interlayer insulating film more than using silicon oxide. Since tight adhesion to another insulating film is good, reliability of the semiconductor device can be improved.

According to another aspect of the present invention, there is provided a method of manufacturing a semiconductor device, comprising steps of: forming a first insulating film consisting of insulating material on a semiconductor substrate; forming a second insulating film consisting of insulating metal nitride on said first insulating film; patterning said second insulating film; and etching said first insulating film by using said second insulating film as a mask.

An etching selectivity between an interlayer insulating film made of metal nitride and an insulating film containing silicon and carbon as its main composition can be made large. The interlayer insulating film made of metal nitride can be easily worked.

According to another aspect of the present invention, there is provided a method of manufacturing a semiconductor device, comprising steps of: forming a first insulating film on a semiconductor substrate, at least a surface layer of said first insulating film consisting of metal nitride; forming a second insulating film consisting of inorganic insulating material containing silicon on said first insulating film; forming a recess in a lamination structure of said second and first insulating films; depositing a conductive film consisting of conductive material on said second insulating film, said conductive film being filled in said recess; and polishing said conductive film until said second insulating film is exposed, and leaving a portion of said conductive film in said recess.

The first insulating film made of metal nitride is covered with the second insulating film during the process of polishing the conductive film. The first insulating film is not exposed to polishing liquid and the like.

As above, by using the insulating metal nitride as a mask for etching the insulating film made of low dielectric constant insulating material, the etching selectivity can be made large so that the insulating film can be easily worked.

DESCRIPTION OF THE PREFERRED EMBODIMENTS

Figure 1:
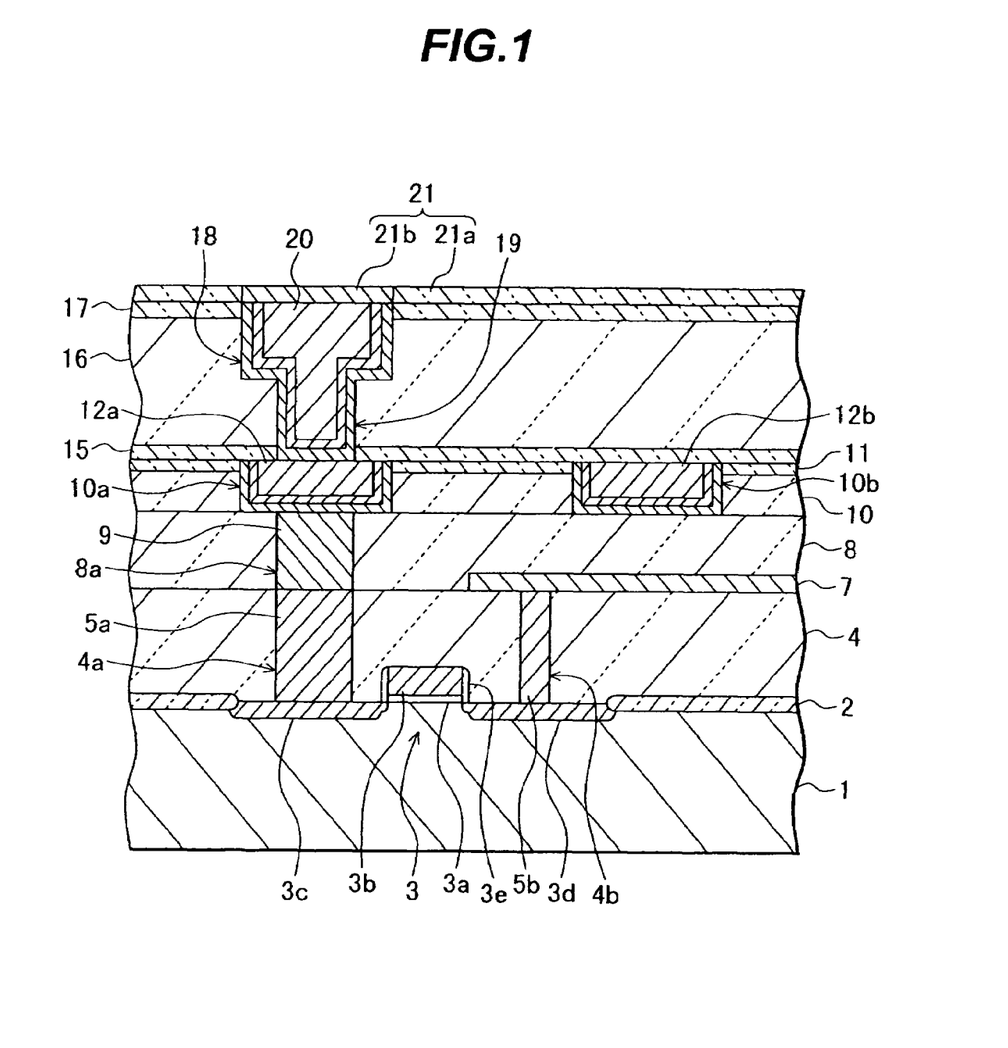
FIG. 1 is a cross sectional view of a semiconductor device according to a first embodiment.

FIG. 1 is a cross sectional view of a semiconductor device according to a first embodiment. An element separation insulating film 2 is formed on the surface of a semiconductor substrate 1 of p-type silicon, active regions being defined by the element separation insulating film 2. A MOS transistor 3 is formed in the active region. The MOS transistor 3 is constituted of a gate insulating film 3a, a gate electrode 3b and impurity doped regions 3c and 3d. One of the impurity doped regions 3c and 3d is a source region and the other is a drain region.

The impurity doped regions 3c and 3d are formed in the substrate surface layer on both sides of the gate electrode 3b and have a lightly doped drain (LDD) structure. Sidewall spacers 3e made of insulating material are formed on the sidewalls of the gate electrode 3b. The sidewall spacers 3e are used as a mask when ions are implanted in high concentration regions of the impurity doped regions 3c and 3d.

A first interlayer insulating film 4 of silicon oxide ($SiO_2$) is formed on the semiconductor substrate 1, covering the MOS transistor 3. Contact holes 4a and 4b are formed through the first interlayer insulating film 4 in the areas corresponding to the impurity doped regions 3c and 3d. Conductive plugs 5a and 5b are buried in the contact holes 4a and 4b. Each of the plugs 5a and 5b is constituted of a barrier metal layer of titanium nitride (TiN) covering the sidewall and bottom of the plug and a tungsten member formed on the barrier metal layer.

A first layer wiring pattern 7 made of tungsten is formed on the first interlayer insulating film 4. This wiring pattern 7 is connected to the impurity doped region 3d of the MOS transistor 3 via the plug 5b.

On the first interlayer insulating film 4, a second interlayer insulating film 8 is formed covering the first wiring pattern 7. The second interlayer insulating film 8 is made of silicon oxide, borophosphosilicate glass (BPSG), or phosphosilicate glass (PSG). A contact hole 8a is formed through the second interlayer insulating film 8 in the area corresponding to the plug 5a. A conductive plug 9 is buried in this contact hole 8a.

These structures described above can be formed by well known thin film forming techniques, photolithography, ion implantation, chemical mechanical polishing (CMP) and the like.

A third interlayer insulating film 10 of low dielectric constant insulating material and a first mask layer 11 of high resistance zirconium nitride are formed on and above the second interlayer insulating film 8. The insulating film material having a low dielectric constant includes organic polymer having carbon as its main composition, carbon-containing silicon oxide, and porous materials of these materials. Wiring trenches 10a and 10b are formed through the third interlayer insulating film 10 and first mask layer 11. Second layer wiring patterns 12a and 12b are buried in the wiring trenches 10a and 10b.

Each of the wiring patterns 12a and 12b has a three-layer structure made of a barrier metal layer covering the side wall and bottom of the wiring trench 10a, 10b, a seed layer covering the surface of the barrier metal layer, and a main wiring material member filled in the wiring trench and covering the seed layer. The barrier metal layer is made of tantalum (Ta), tantalum nitride (TaN), titanium nitride (TiN) or the like. The barrier metal layer may have a lamination structure of a Ta layer and a TaN layer. The seed layer and main wiring material member are made of copper or alloy containing copper as its main composition.

On and above the wiring patterns 12a and 12b and first mask layer 11, an etching stopper layer 15, a fourth interlayer insulating film 16 and a second mask layer 17 are laminated in this order. The etching stopper layer 15 is made of silicon carbide (SiC) or silicon nitride (SiN). The fourth interlayer insulating film 16 is made of low dielectric constant insulating material. The second mask layer 17 is made of high resistance zirconium nitride.

A wiring trench 18 is formed in the second mask layer 17 and fourth interlayer insulating film 16 to the intermediate depth of the fourth interlayer insulating film 16. A via hole 19 is formed in the fourth interlayer insulating film 16 and etching stopper layer 15, the via hole interconnecting the bottom of the wiring trench 18 and the upper surface of the second wiring pattern 12a.

A third layer wiring pattern 20 is buried in the wiring trench 18 and via hole 19. The third wiring pattern 20 is constituted of a barrier metal layer covering the side wall and bottom of the wiring trench 18 and via hole 19, a seed layer covering the barrier metal layer, and a main wiring material member buried in the wiring trench 18 and via hole 19 and covering the seed layer. The materials of the barrier metal layer, seed layer and main wiring material member are the same as those of the second wiring pattern 12a.

A cover layer 21 of zirconium nitride is formed on the second mask layer 17 and third wiring pattern 20. A region 21b of the cover layer 21 on the wiring pattern 20 has a low resistance, and a region 21a on the second mask layer 17 has a high resistance. Therefore, the third wiring pattern 20 can be electrically connected to an upper layer wiring pattern via the low resistance region 21b.

Next, with reference to FIGS. 2A to 2J, a method of manufacturing the semiconductor device of the first embodiment will be described.

Figure 2A:
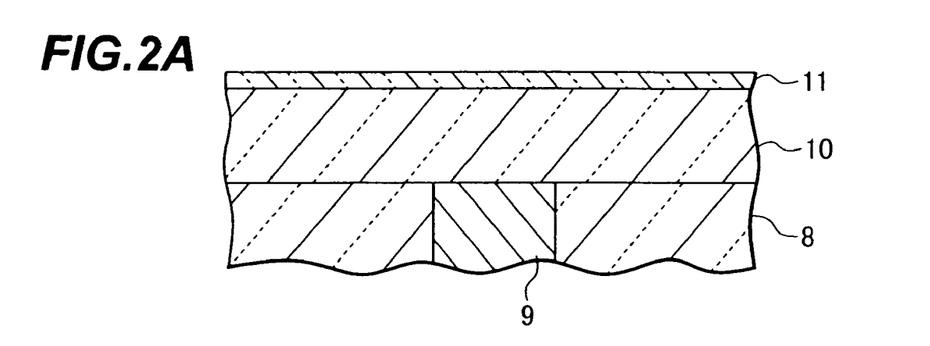
FIGS. 2A to 2J are cross sectional views of a substrate illustrating a method of manufacturing the semiconductor device of the first embodiment.

As shown in FIG. 2A, on the second interlayer insulating film 8 and plug 9, the third interlayer insulating film 10 of low dielectric constant insulating material is formed. If organic polymer is used as the low dielectric constant insulating material, polymer dissolved in organic solvent is spin-coated on the substrate surface. If carbon-containing silicon oxide is used as the low dielectric constant insulating material, the third interlayer insulating film 10 can be formed by plasma enhanced chemical vapor deposition (PE-CVD). If porous insulating material is used as the low dielectric constant insulating material, the third interlayer insulating film 10 can be formed by forming a hollow film through hydrolysis and condensation/polymerization by a sol-gel method, thermal decomposition of unstable components, formation of a mold intermediate structure, and thermal decomposition of the mold intermediate structure. For this thermal composition, a heat treatment at about 400° C. becomes necessary.

The first mask layer 11 of zirconium nitride is formed on the third interlayer insulating film 10 by CVD. Source material to be used is tetrakis diethylamino zirconium (Zr(N(C$_2$H$_5$)$_2$)$_4$) and ammonium (NH$_3$). A film forming temperature is 300 to 400° C. Ammonium is not necessarily required to be added. Under these conditions, zirconium nitride is grown on silicon oxynitride, silicon nitride, silicon oxyfluoride, or low dielectric constant organic polymer. The grown zirconium nitride is an insulator. As will be later described, zirconium nitride grown on the metal surface under the same conditions is a conductor.

Figure 2B:
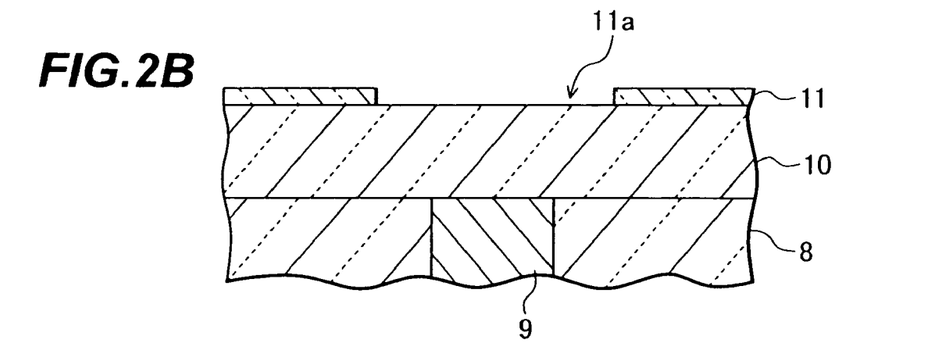

As shown in FIG. 2B, an opening 11a corresponding to the second wiring pattern 12a, 12b shown in FIG. 1 is formed through the first mask layer 11. Etching the first mask layer 11 may be performed by dry etching using gas which contains chlorine (Cl$_2$) or hydrogen bromide (HBr).

Figure 2C:
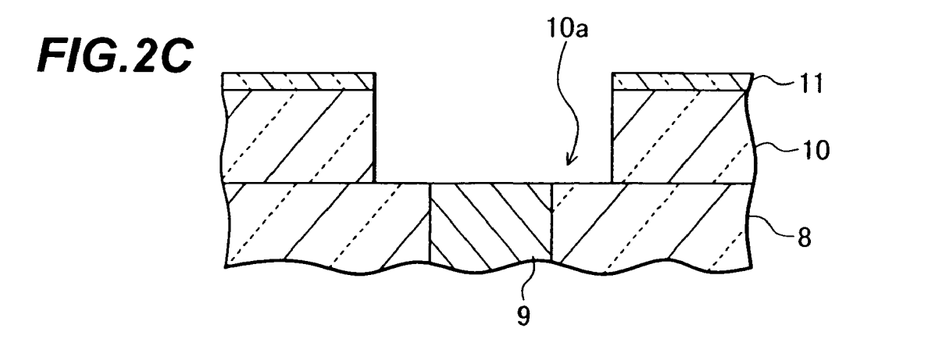

As shown in FIG. 2C, by using the first mask layer 11 as a mask, the third interlayer insulating film 10 is etched to form the wiring trench 10a. If the third interlayer insulating film 10 is made of organic polymer, the third interlayer insulating film 10 may be etched by using plasma of mixture gas of hydrogen and nitrogen.

Figure 2D:
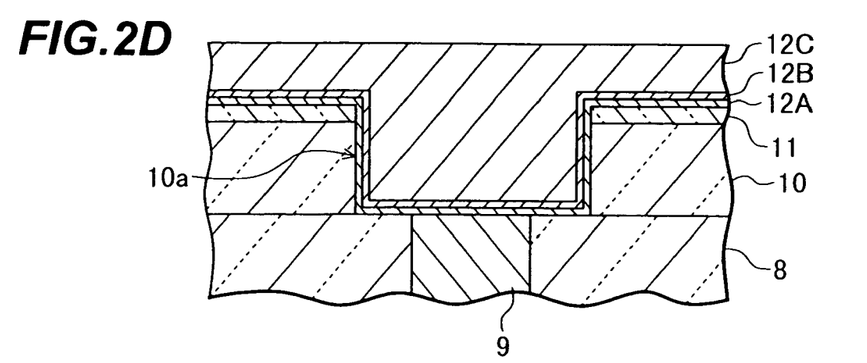

As shown in FIG. 2D, a barrier metal layer 12A made of Ta, TaN, TiN or the like is formed by sputtering, the barrier metal layer 12A covering the side wall and bottom of the wiring trench 10a and the upper surface of the first mask layer 11. A seed layer 12B made of copper is formed on the barrier metal layer 12A by sputtering. The seed layer 12B may be formed by sputtering using self-ionization plasma which provides good step coverage. The surface of the seed layer 12B is subjected to electroplating to form a copper layer 12C.

Figure 2E:
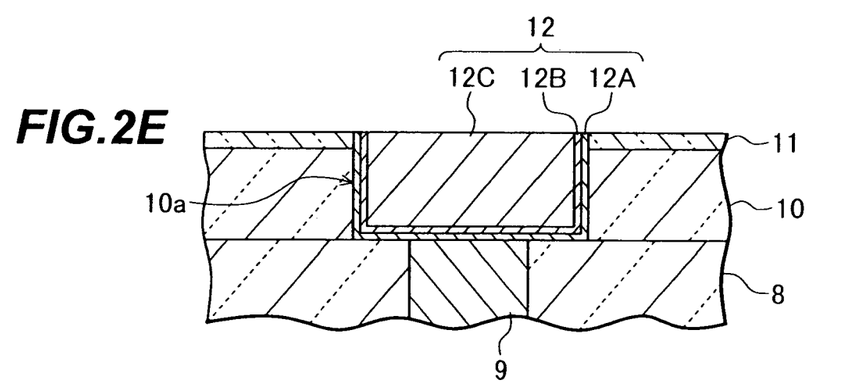

As shown in FIG. 2E, CMP is performed to remove unnecessary portions of the copper layer 12C, seed layer 12B and barrier metal 12A. The second layer wiring pattern 12 is therefore left in the wiring trench 10a, the second layer wiring pattern being made of the barrier metal layer 12A, seed layer 12B and main wiring material member 12C.

Figure 2F:
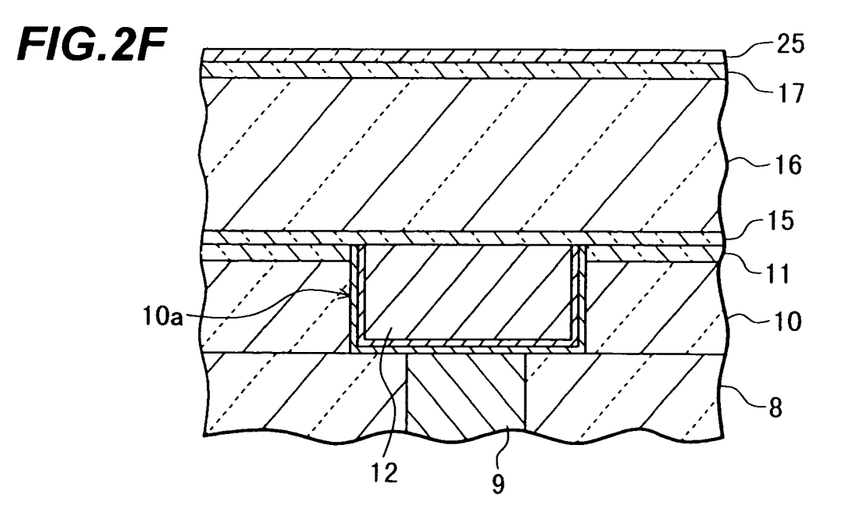

As shown in FIG. 2F, on and above the first mask layer 11 and second layer wiring pattern 12, the etching stopper layer 15, fourth interlayer insulating film 16, second mask layer 17 and third mask layer 25 are formed in this order.

The etching stopper layer 15 made of silicon carbide or silicon nitride may be formed by PE-CVD. If a silicon carbide film is to be formed, organic silane which contains methylsilane is used as source gas, and if necessary, gas such as a methane, nitrogen and helium is added. If a silicon nitride film is to be formed, monosilane, disilane, organic silane or the like is used as the source of silicon, and nitrogen gas or ammonium is used as the source of nitrogen.

The fourth interlayer insulating film 16 can be formed by a method similar to the method of forming the third interlayer insulating film 10 described with reference to FIG. 2A. The second mask layer 17, made of zirconium nitride can be formed by a method similar to the method of forming the first mask layer 11 described with reference to FIG. 2A.

The third mask layer 25 is made of silicon carbide or silicon nitride or silicon oxide. A method of forming the third mask layer 25 is similar to the method of forming the etching stopper layer 15.

Figure 2G:
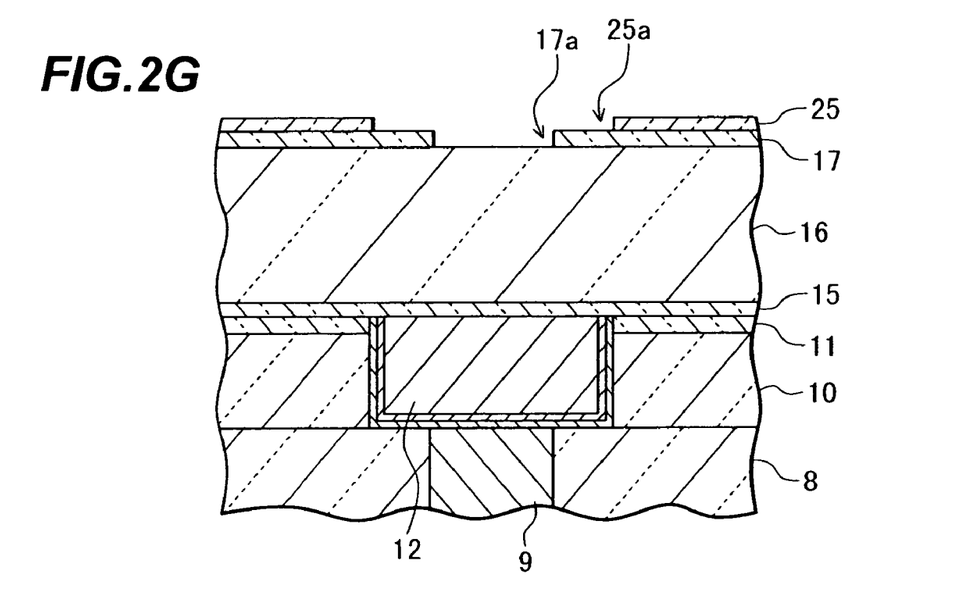

As shown in FIG. 2G, a resist pattern is formed on the third mask layer 25 and the third mask layer 25 is partially etched to form an opening 25a corresponding to the wiring trench 18 shown in FIG. 1. After the resist pattern used for forming the opening 25a is removed, a new mask pattern is formed on the second and third mask layers 17 and 25. By using this new mask pattern as a mask, the second mask layer 17 is etched to form an opening 17a corresponding to the via hole 19 shown in FIG. 1. After the opening 17a is formed, the resist pattern used as the mask is removed.

Figure 2H:
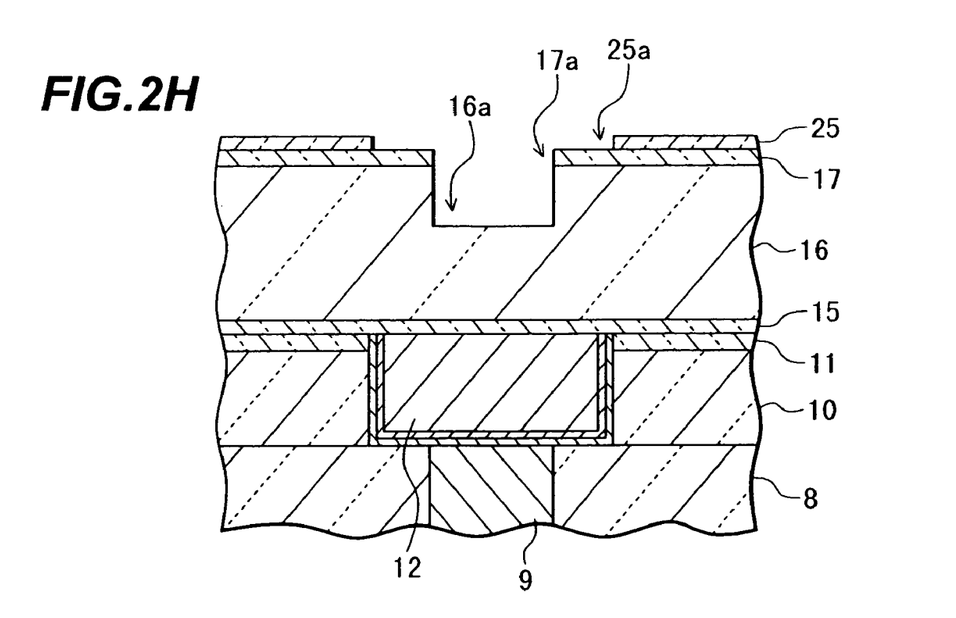

As shown in FIG. 2H, by using the second and third mask layers 17 and 25 as a mask, the fourth interlayer insulating film 16 exposed on the bottom of the opening 17a is etched to the intermediate depth of the fourth interlayer insulating film 16 to form a recess 16a. Etching the fourth interlayer insulating film 16 can be performed by a method similar to the method of etching the third interlayer insulating film 10 described with reference to FIG. 2C.

Figure 2I:
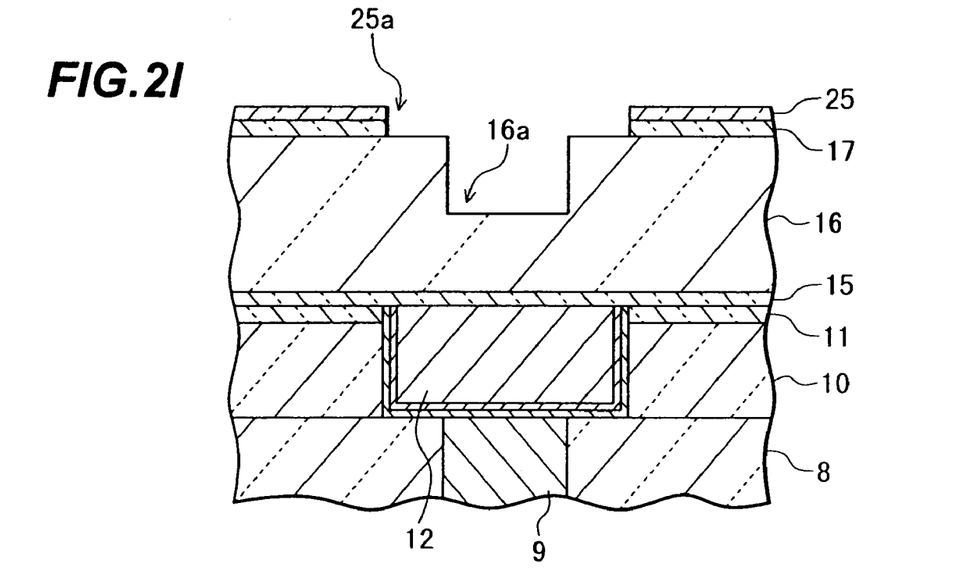

As shown in FIG. 2I, by using the third mask layer 25 as a mask, the second mask layer 17 exposed on the bottom of the opening 25a is etched.

Figure 2J:
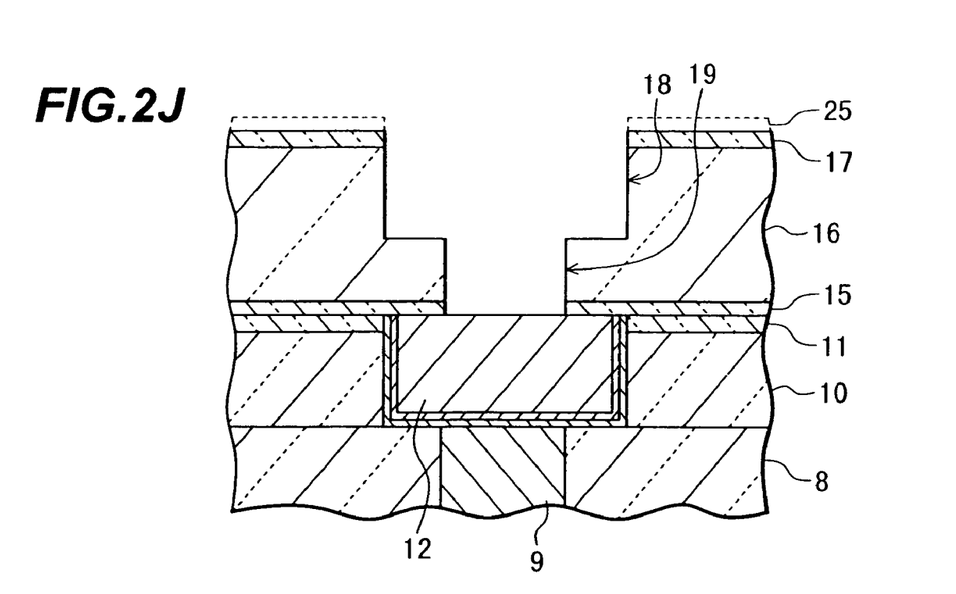

As shown in FIG. 2J, by using the third and second mask layers 25 and 17 as a mask, the fourth interlayer insulating film 16 is etched. The recess 16a shown in FIG. 2I becomes deeper and the via hole 19 is therefore formed. At this stage, the etching stopper film 15 is left on the bottom of the via hole 19, and the fourth interlayer insulating film 16 is further etched to the intermediate depth thereof in the area where the recess 16a was not formed to thereby form the wiring trench 18.

The etching stopper film 15 exposed on the bottom of the via hole 19 is removed to expose the upper surface of the second layer wiring pattern 12. The etching stopper film 15 can be removed by dry etching mainly using gas which contains carbon fluoride. During this etching, the third mask layer 25 is also removed.

As shown in FIG. 1, the third layer wiring pattern 20 is buried in the wiring trench 18 and via hole 19. The wiring pattern 20 can be formed by a method similar to the method of forming the second layer wiring pattern 12 described with reference to FIGS. 2D and 2E.

The cover layer 21 made of zirconium nitride is formed on the second mask layer 17 and third layer wiring pattern 20. The cover layer 21 can be formed by a method similar to the method of forming the first mask layer 11 described with reference to FIG. 2A. As the zirconium nitride film is formed by this method, the region 21b of the film on the wiring pattern 20 has a low resistance and the region 21a on the second mask layer 17 has a high resistance. The low resistance region 21b is substantially a conductor and the high resistance region 21a is substantially an insulator.

The measurement results of electric resistance of actually formed zirconium nitride films will be described.

Zirconium nitride film was formed on a silicon oxide film and a titanium nitride film by CVD using tetrakis diethylamino zirconium and ammonium as source gas. The growth temperature of the zirconium nitride film was set to 380° C.

The zirconium nitride film having a thickness of 20 nm or thinner and formed on the silicon oxide film became an insulating film having a specific resistance of several thousands µΩcm or higher. In contrast, the zirconium nitride film having a thickness of 20 nm or thinner and formed on the titanium nitride film became an conductive film having a specific resistance of about 300 µΩcm or lower. Even if the material of the underlying conductive layer is not titanium nitride but copper, the zirconium nitride film becomes a conductive film. This nature is also true for a zirconium nitride not formed by CVD but formed by sputtering, vapor deposition or the like.

In the first embodiment, the first mask layer 11 of zirconium nitride is used as a mask during the process of etching the third interlayer insulating film 10 described with reference to FIG. 2C. As compared to a conventional mask made of silicon nitride or the like, an etching selectivity can be made large. It is therefore easy to work the interlayer insulating film made of low dielectric constant insulating material.

As the material of the first mask layer 11 shown in FIG. 1, for example, silicon nitride is used. A specific dielectric constant of silicon nitride is higher than silicon oxide so that the effects of forming the third interlayer insulating film 10 by using low dielectric constant insulating material is diminished. The specific dielectric constants of the zirconium nitride films formed on the USG film and having a thicknesses of about 15 nm and 30 nm were 2 to 3, and 3.5 to 4, respectively. These specific dielectric constants are similar to or lower than that of silicon oxide. It is therefore possible to enhance the parasitic capacitance reduction effects between wiring lines.

In the first embodiment, although the first mask layer 11 is made of zirconium nitride, it may be made of nitride which contains zirconium, titanium or hafnium as a constituent element.

Figure 3:
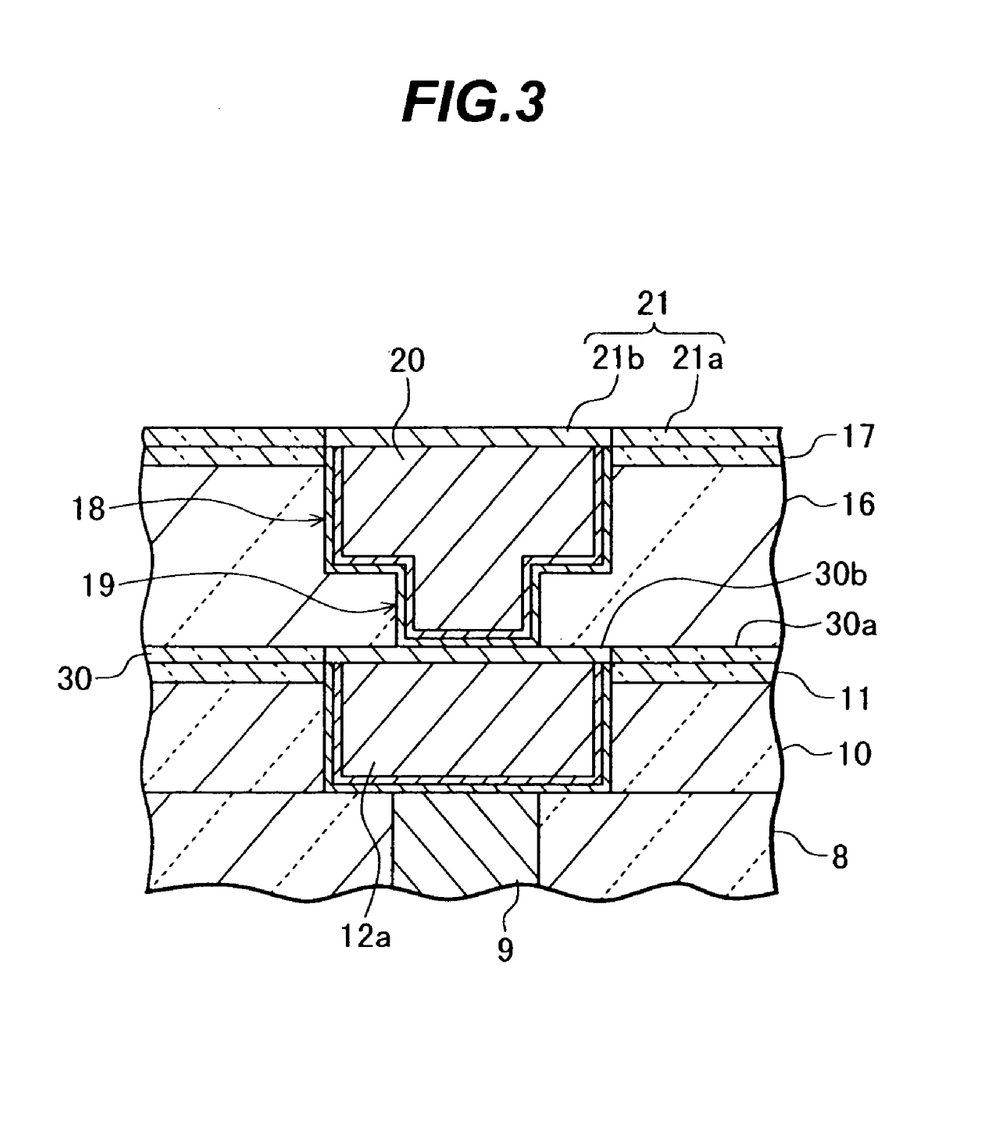
FIG. 3 is a cross sectional view of a semiconductor device according to a second embodiment.

FIG. 3 is a cross sectional view of a semiconductor device according to a second embodiment of the invention. Different points from the semiconductor device of the first embodiment shown in FIG. 1 will be described.

In the first embodiment, the material of the etching stopper layer 15 used when the via hole 19 is formed in the fourth interlayer insulating film 16 is silicon carbide or silicon nitride. In the second embodiment, instead of the etching stopper layer 15, an etching stopper layer 30 of zirconium nitride is used. Similar to the cover film 21, in the etching stopper layer 30, a region 30b on the wiring pattern 12a has a low resistance and a region 30a on the first mask layer 11 has a high resistance.

In the first embodiment, the etching stopper layer 15 exposed on the bottom of the via hole 19 is removed. In the second embodiment, the etching stopper layer 30 is left on the bottom of the via hole 19. Since the region 30b on the wiring pattern 12a has a low resistance, the second layer and third layer wiring patterns 12a and 20 can be electrically connected even if the etching stopper layer 30 is left.

By forming the etching stopper layer 30 by using zirconium nitride, an etching selectivity can be made large between the fourth interlayer insulating film 16 made of low dielectric constant insulating material and the etching stopper layer 30.

In the second embodiment, the etching stopper layer 30 made of zirconium nitride is disposed between the second layer wiring pattern 12a and fourth interlayer insulating film 16. This etching stopper layer 30 functions as an adhesive layer so that tight adhesion between the wiring pattern 12a made of copper and the fourth interlayer insulating film 16 can be improved. Zirconium films having thicknesses of 5 nm and 15 nm were formed on a copper surface and insulating films made of SiLK (trademark of Dow Chemical Company), low dielectric constant polymer, were formed on the zirconium nitride films. Tape tests were conducted. The SiLK insulating films were not scaled off. The SiLK insulating films were formed by coating SiLK and thereafter performing baking at 320° C. for 90 seconds and curing at 400° C. for 30 minutes.

Figure 7:
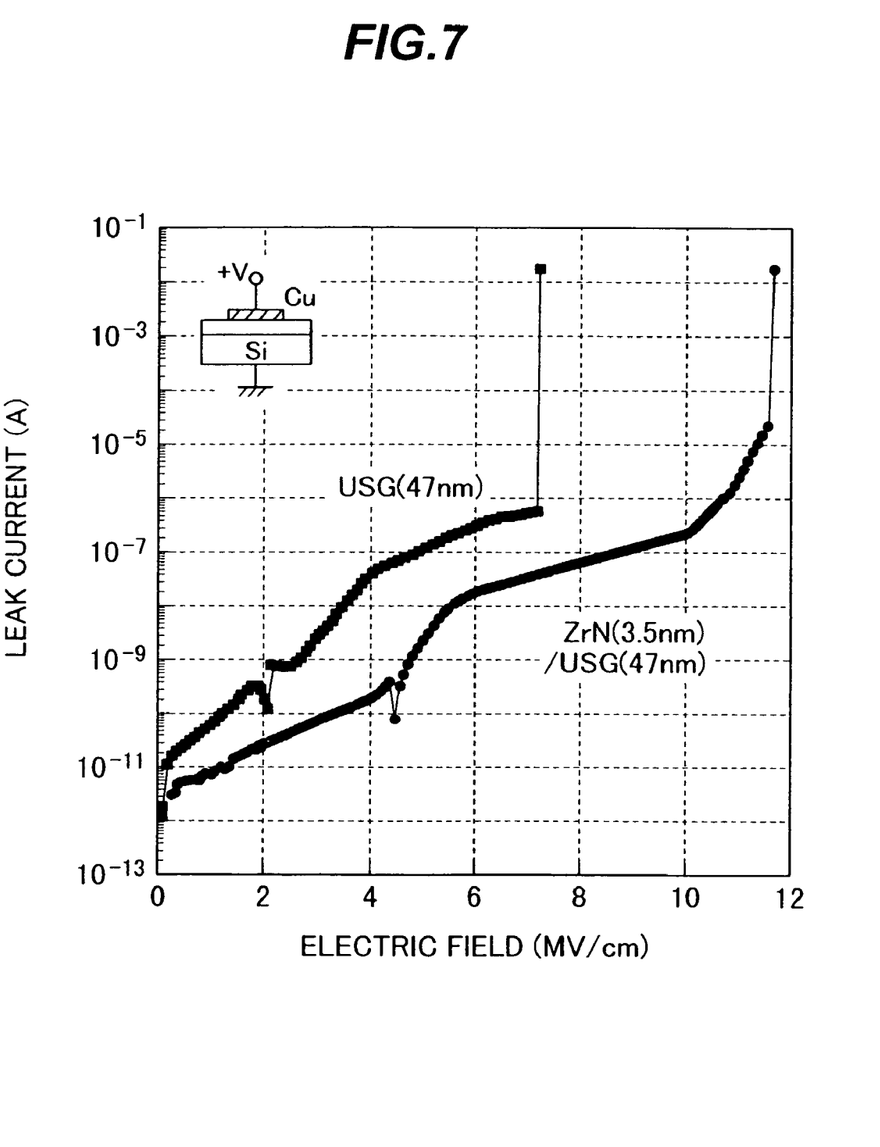
FIG. 7 is a graph showing the breakdown voltage characteristics of a silicon/USG/copper structure and a silicon/USG/ZrN/copper structure.
Figure 8:
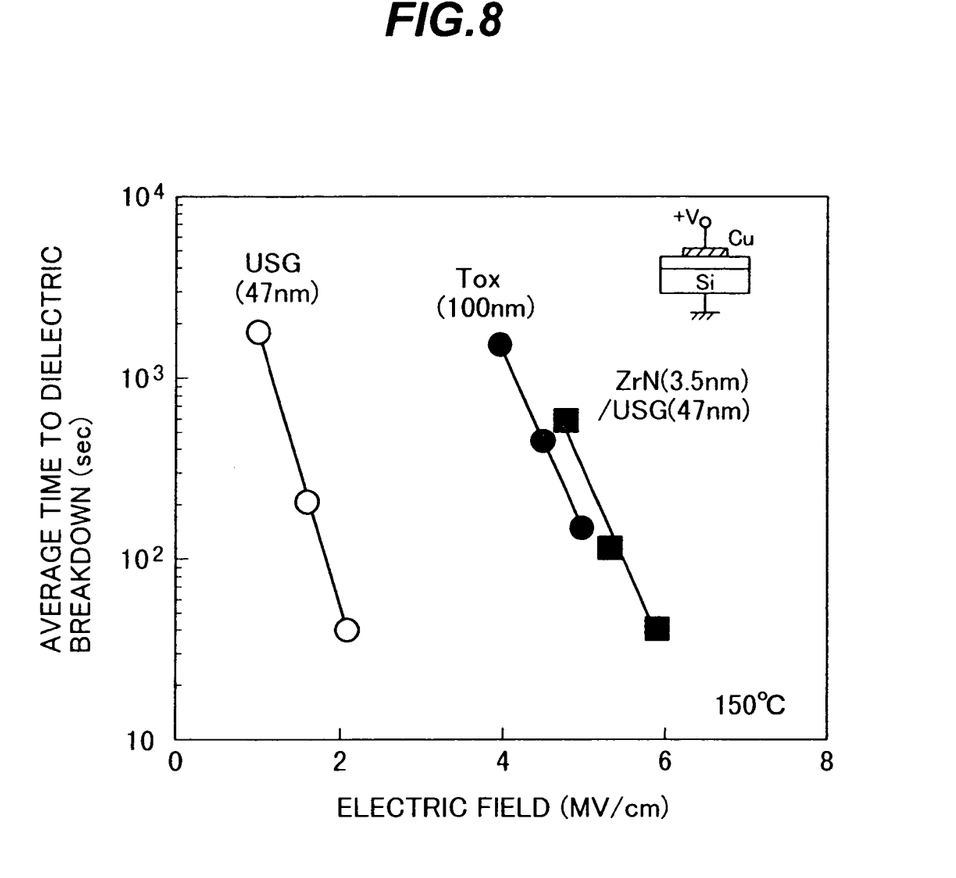
FIG. 8 is a graph showing the breakdown voltage characteristics of a silicon/USG/copper structure, a silicon/thermally oxidized film/copper structure, and a silicon/USG/ZrN/copper structure.

In the second embodiment, the upper surface of the second wiring pattern 12a is covered with the etching stopper layer 30 made of zirconium nitride. This etching stopper layer 30 also functions as a barrier layer for preventing copper of the wiring pattern 12a from diffusing into the fourth interlayer insulating film 16. With reference to FIGS. 7 and 8, the barrier function of the zirconium nitride film will be described.

FIG. 7 shows the breakdown voltage characteristics of a USG film and the lamination structure of a USG film and a zirconium nitride film. The abscissa represents an electric field in the unit of "MV/cm" and the ordinate represents a leak current in the unit of "A".

First and second samples were prepared, the first sample having a USG film and a copper electrode formed in this order on a silicon substrate, and the second sample having a USG film, a zirconium nitride film and a copper electrode formed in this order on a silicon substrate. The thickness of the USG film of the first sample is 47 nm. The thickness of the USG film of the second sample is 47 nm and the thickness of the zirconium nitride film is 3.5 nm. A black square in the graph shows a leak current of the first sample, and a black circle shows a leak current of the second sample.

The first sample had a dielectric breakdown when the electric field increased to 7.4 MV/cm. The electric field increase speed was 0.1 MV/cm·s. The dielectric breakdown is considered to occur because of the diffusion of copper atoms in the copper electrode into the USG film. The second sample had a dielectric breakdown when the electric field increased to 11.6 MV/cm. By inserting the zirconium nitride film between the copper electrode and USG film, the breakdown voltage can be raised. This suggests that the zirconium nitride film suppresses copper from diffusing from the copper electrode to the USG film.

By inserting the zirconium nitride film, the leak current itself can be reduced.

FIG. 8 shows average times to dielectric breakdown of third to fifth samples. The third sample has the structure that a USG film of 47 nm thick and a copper electrode are formed in this order on a silicon substrate. The fourth sample has the structure that a thermally oxidized film (Tox) of 100 nm thick and a copper electrode are formed in this order on a silicon substrate. The fifth sample has the structure that a USG film of 47 nm thick, a zirconium nitride film of 3.5 nm thick and a copper electrode are formed in this order on a silicon substrate.

The abscissa of FIG. 8 represents an electric field in the unit of "MV/cm" and the ordinate represents an average time to dielectric breakdown in the unit of "second". An environmental temperature was set to 150° C. By inserting the zirconium nitride film between the USG film and copper electrode, the average time to dielectric breakdown is prolonged under the same electric field condition. This suggests that the zirconium nitride film suppresses the diffusion of copper.

Figure 4:
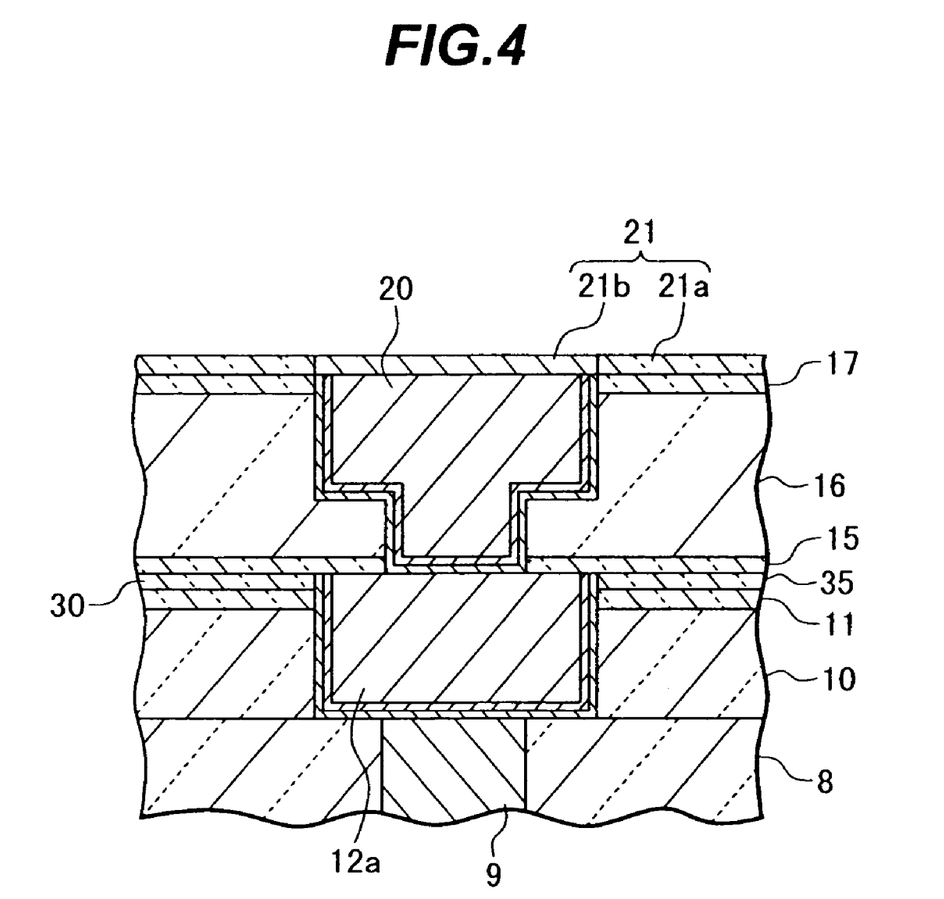
FIG. 4 is a cross sectional view of a semiconductor device according to a third embodiment.

FIG. 4 is a cross sectional view of a semiconductor device according to a third embodiment of the invention. Different points from the semiconductor device of the first embodiment shown in FIG. 1 will be described.

In the first embodiment, the first mask layer 11 and etching stopper layer 15 are in direct contact with each other as shown in FIG. 1. In the third embodiment, between the first mask layer 11 and etching stopper layer 15, a sacrificial film 35 is disposed which is made of inorganic insulating material containing silicon as its constituent element, such as USG, silicon carbide and silicon nitride. With reference to FIGS. 5A to 5E, the method of manufacturing the semiconductor device of the third embodiment will be described.

Figure 5A:
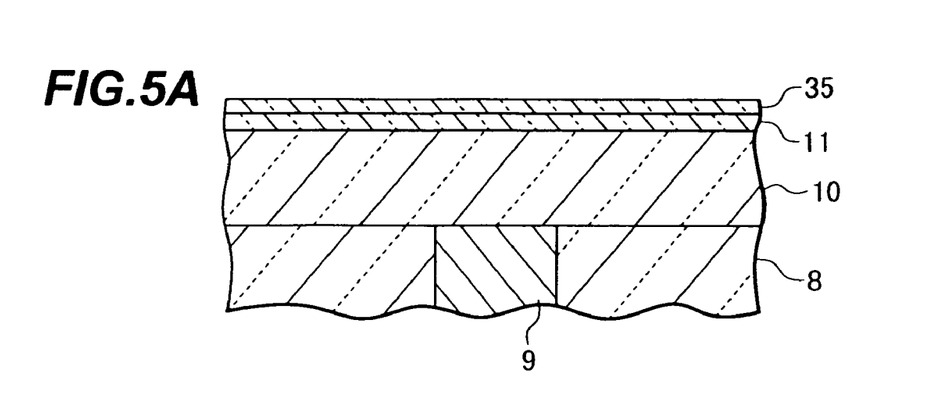
FIGS. 5A to 5E are cross sectional views of a substrate illustrating a method of manufacturing the semiconductor device of the third embodiment.

As shown in FIG. 5A, the layers up to the first mask layer 11 are formed by a method similar to the first embodiment method described with reference to FIG. 2A. The sacrificial film 35 of USG is formed on the first mask layer 11. The USG film can be formed by CVD using silane or tetraethoxysilane (TEOS) as source gas, oxygen ($O_2$) or $NN_2O$ as oxidizing gas, and argon (Ar) or nitrogen ($N_2$) as carrier gas. The sacrificial film 35 may be made of silicon carbide or silicon nitride.

Figure 5B:
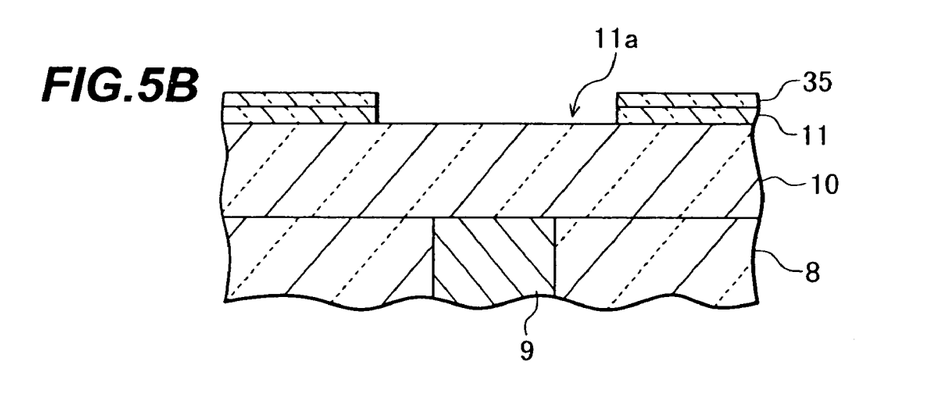

As shown in FIG. 5B, an opening 11a for forming a wiring trench is formed through the sacrificial film 35 and first mask layer 11.

Figure 5C:
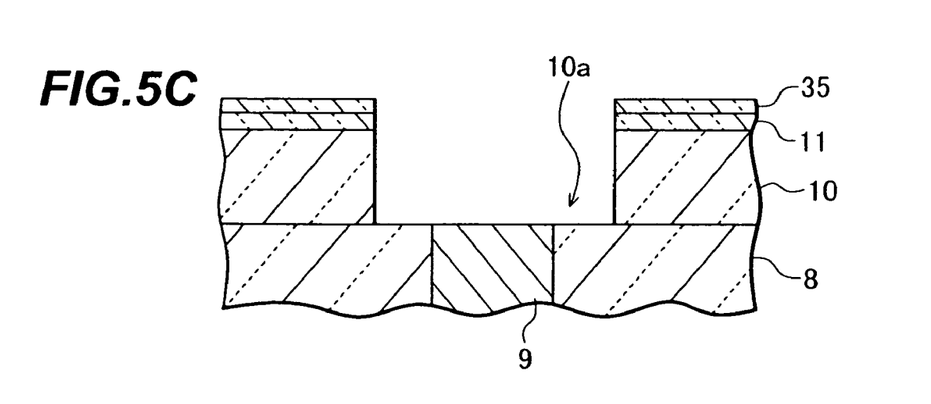

As shown in FIG. 5C, by using the sacrificial film 35 and first mask layer 11 as a mask, the third interlayer insulating film 10 is etched to form the wiring trench 10a.

Figure 5D:
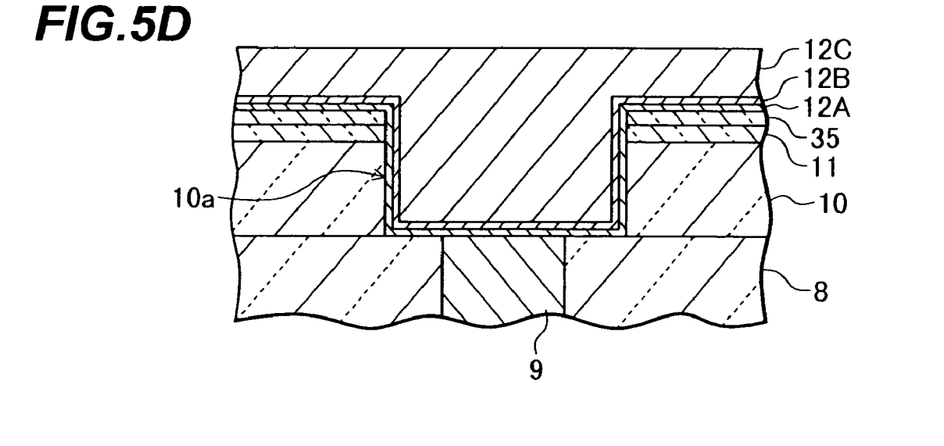

As shown in FIG. 5D, a barrier metal layer 12A and a seed layer 12B are formed on the inner surface of the wiring trench 10a and on the surface of the sacrificial film 35. A main wiring material member 12C is formed on the seed layer 12B by plating, the main wiring material member 12C being buried in the wiring trench 10a.

Figure 5E:
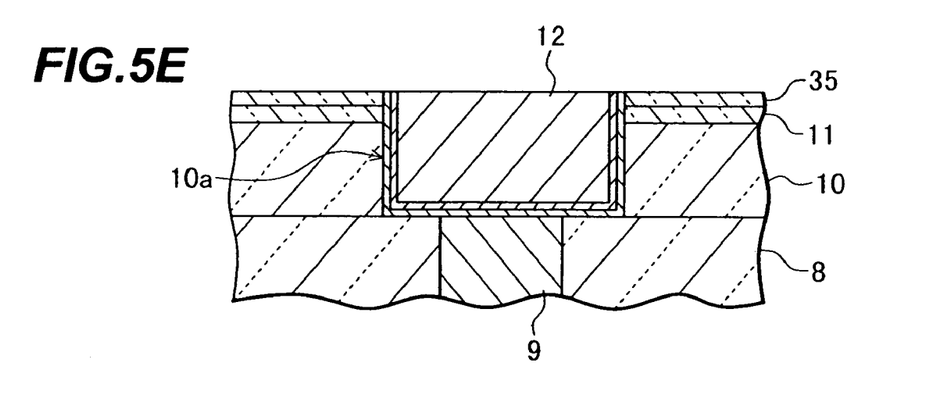

As shown in FIG. 5E, CMP is performed to remove unnecessary portions of the main wiring material member 12C, seed layer 12B and barrier metal layer 12A to leave the wiring pattern 12 in the wiring trench 10a. In this case, since the first mask layer 11 of zirconium nitride is covered with the sacrificial film 35, the first mask layer 11 is prevented from being exposed in the CMP environment. The first mask layer 11 enhances the tight adhesion between the third interlayer insulating film 10 and sacrificial film 35.

A tight adhesion strength test (mELT: Modified Edge Lift-off Test) was performed for two types of samples having SiLK insulating films of 150 nm thick and 450 nm thick formed on silicon oxide films thermally oxidized. The K values were about 0.21 and 0.30, respectively. In contrast, the sample having a zirconium nitride film of 4 nm thick formed on a silicon oxide film thermally oxidized and a SiLK insulating film of 250 nm thick formed on the zirconium nitride film had a K value of 0.40 or higher. It can be understood that the zirconium nitride film improves the tight adhesion between the silicon oxide film and SiLK insulating film.

Figure 6:
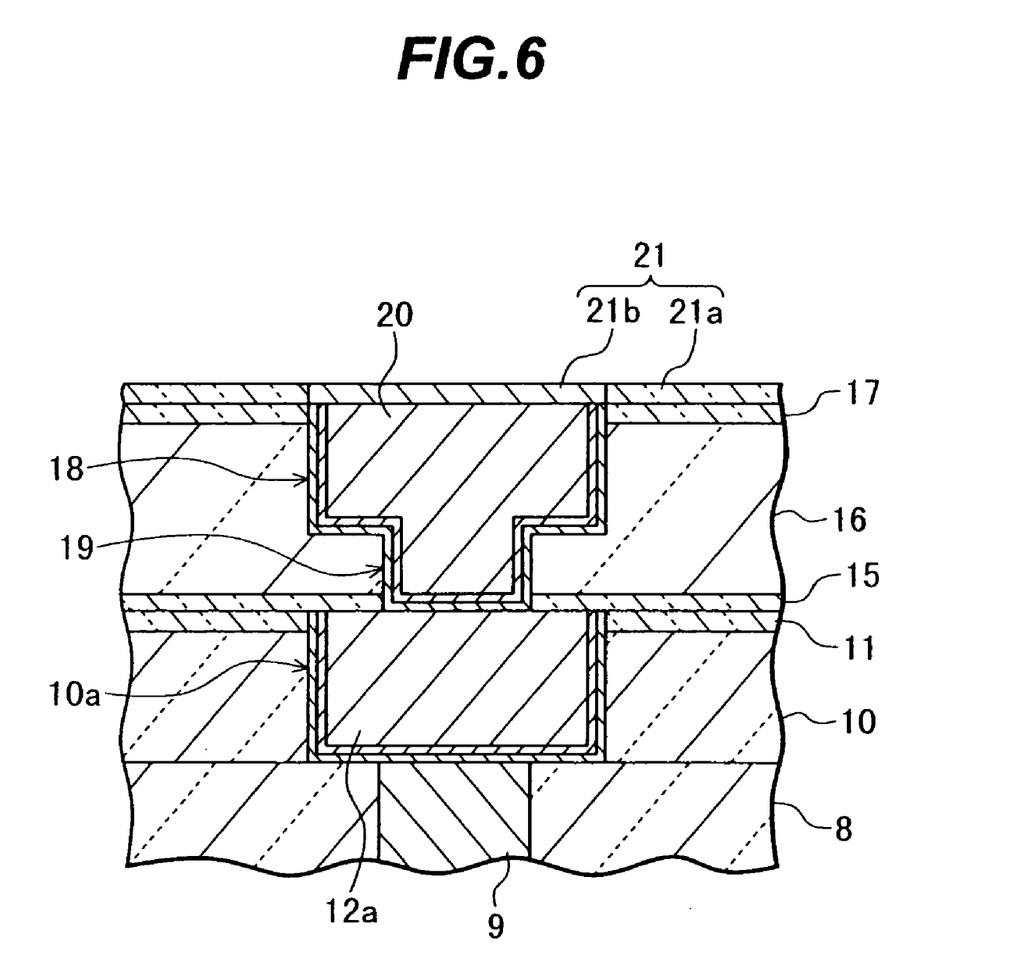
FIG. 6 is a cross sectional view of a semiconductor device according to a fourth embodiment.

FIG. 6 is a cross sectional view of a semiconductor device according to a fourth embodiment of the invention. The cross sectional shape of the semiconductor device of the fourth embodiment is the same as that of the semiconductor device of the first embodiment shown in FIG. 1. In the first embodiment, the third and fourth interlayer insulating films 10 and 16 are made of low dielectric constant insulating material such as SiLK. In the fourth embodiment, the third and fourth interlayer insulating films 10 and 16 are made of high resistance zirconium nitride.

In the fourth embodiment, the first mask layer 11 is made of USG, silicon carbide or silicon nitride. By using the first mask layer 11 as a mask, the third interlayer insulating film 10 of zirconium nitride is etched to form the wiring trench 10a. Zirconium nitride can be dry-etched by using gas which contains chlorine ($Cl_2$) or bromide hydrogen (HBr).

The third layer wiring pattern 20 is formed by the dual damascene method described with reference to FIGS. 2F to 2J. In the fourth embodiment, the third mask layer 25 shown in FIGS. 2F to 2I is made of the same material as that of the etching stopper layer 15, and the second mask layer 17 is made of USG, silicon carbide or silicon nitride whichever is different from the material of the third mask layer 25.

In the fourth embodiment, zirconium nitride is used as the material of the third and fourth interlayer insulating films. The dielectric constant of zirconium nitride can be made lower than that of silicon oxide. It is therefore possible to reduce the parasitic capacitance between wiring lines.

In an crossed area between another wiring pattern disposed in the same wiring layer as that of the second layer wiring pattern 12a and another wiring pattern disposed in the same wiring layer as that of the third layer wiring pattern 20, the other wiring patterns can be electrically insulated by the lamination structure of the etching stopper layer 15 and third interlayer insulating film 10. In order to obtain sufficient parasitic capacitance reduction effects between the other wiring patterns, it is preferable to adopt the structure that the third interlayer insulating film 10 occupies a half or more of the distance between the other wiring patterns in the crossed area.

Since a zirconium nitride film can be formed without using plasma, the manufacture processes can be simplified. Instead of a zirconium nitride film, a film made of nitride which contains zirconium, titanium or hafnium as a constituent element may be used.

The present invention has been described in connection with the preferred embodiments. The invention is not limited only to the above embodiments. It is apparent that various modifications, improvements, combinations, and the like can be made by those skilled in the art.

The invention claimed is:

1. A semiconductor device comprising:
   a first insulating film formed on a semiconductor substrate;
   a second insulating film consisting of zirconium nitride and formed on said first insulating film;
   a recess formed through said second insulating film and reaching a position deeper than an upper surface of said first insulating film;
   a conductive member filled in said recess; and a third insulating film formed on said second insulating film, said recess extending through said third insulating film and consisting of inorganic insulating material containing silicon as a constituent element.

2. A semiconductor device according to claim 1, wherein said first insulating film consists of insulating material having a dielectric constant lower than a dielectric constant of said third insulating film, and materials of said first to third insulating films are selected in such a manner that a tight adhesion strength of said third insulating film is increased when said second insulating film is inserted between said first and third insulating films more than when said third insulating film is directly disposed on said first insulating film.

* * * * *